(12) United States Patent
Yamazaki

(10) Patent No.: US 7,697,578 B2
(45) Date of Patent: Apr. 13, 2010

(54) WAVELENGTH VARIABLE LASER

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 42 days.

(21) Appl. No.: 11/896,051

(22) Filed: Aug. 29, 2007

(65) Prior Publication Data

US 2008/0056313 A1    Mar. 6, 2008

(30) Foreign Application Priority Data

Aug. 31, 2006    (JP)    ............... 2006-235539

(51) Int. Cl.
*H01S 3/10*    (2006.01)
(52) U.S. Cl. ............... 372/23; 372/28; 372/26; 372/6; 372/94
(58) Field of Classification Search ............ 372/23, 372/28, 26, 6, 94
See application file for complete search history.

(56) References Cited

U.S. PATENT DOCUMENTS

| | | | |
|---|---|---|---|
| 6,046,841 A * | 4/2000 | Mahgerefteh et al. | 359/326 |
| 6,504,971 B1 * | 1/2003 | Margalit et al. | 385/24 |
| 2001/0013962 A1 * | 8/2001 | Li | 359/127 |
| 2004/0008933 A1 | 1/2004 | Mahgerefteh et al. | |
| 2004/0190565 A1 * | 9/2004 | Thourhout | 372/20 |
| 2005/0163512 A1 | 7/2005 | Tayebati et al. | |
| 2006/0029397 A1 * | 2/2006 | Mahgerefteh et al. | 398/187 |

FOREIGN PATENT DOCUMENTS

| | | |
|---|---|---|
| EP | 1 679 771 A2 | 12/2006 |
| JP | 62-100706 | 5/1987 |
| JP | 01-125131 | 5/1989 |
| JP | 08-139401 | 5/1996 |
| JP | 2005-327881 | 11/2005 |

OTHER PUBLICATIONS

European Search Report dated Sep. 25, 2007.

\* cited by examiner

*Primary Examiner*—Minsun Harvey
*Assistant Examiner*—Kinam Park
(74) *Attorney, Agent, or Firm*—McGinn IP Law Group, PLLC

(57) ABSTRACT

The present invention provides a directly modulatable wavelength variable laser that enables long distance and large volume communication with a simple and compact configuration. The wavelength variable laser includes a semiconductor optical amplifier, an optical filter, and a frequency-amplitude converter. The semiconductor optical amplifier produces optical gain of the light signal. The optical filter configured by multi-stage connected waveguide ring resonators performs frequency modulation on the light signal. The frequency-amplitude converter performs amplitude modulation on the light signal frequency modulated in the optical filter.

13 Claims, 2 Drawing Sheets

WAVELENGTH VARIABLE LASER

BACKGROUND OF THE INVENTION

This application is based upon and claims the benefit of priority from Japanese patent application No. 2006-235539, filed on Aug. 31, 2006, the disclosure of which is incorporated herein in its entirety by reference.

The present invention relates to a wavelength variable laser suited for miniaturization and lowering the cost.

With wide spread use of the Internet, high speed and large volume optical communication system is being developed and being put to practical use. In particular, since wavelength fluctuation (hereinafter referred to as wavelength charping) in time of modulation limits the transmission distance in a long distance and large volume communication system, efforts have been made to alleviate such limitation.

FP laser is used for short distance and small volume communications, and DFB (Distributed Feed Back) laser that oscillates at a single wavelength is used for communications at a transmission speed of a few Gb/s. Furthermore, in communications that perform transmission of a few 10 Km at a transmission speed of 10 Gb/s, modulation is not applied to the laser, laser is continuously oscillated, and modulation using an external modulator is performed.

In recent years, WDM (Wavelength Division Multiplexing) transmission technique in which a light signal having a bit rate of greater than or equal to 10 Gb/s is transmitted with one optical fiber is given attention, and introduction of such transmission technique to commercial system is being actively carried out.

However, a great number of light sources having different wavelengths are required in the WDM transmission system, and managing of such light sources is becoming a large issue. A wavelength variable laser that can oscillate in a single mode over a wide range is given attention as a measure for overcoming such problem. Normally, the wavelength variable laser is assumed to be used in combination with an external modulator when being applied to the long distance and large volume communication system. A symmetric Mach-Zehnder interferometer using LN (Lithium Niobium) crystals is being widely used for the external modulator.

SUMMARY OF THE INVENTION

Modulation using the external modulator described above is a method in which wavelength charping is small and which is most suited for the present long distance and large volume communications.

However, a CW (Continuous Oscillation) light source and a modulator are required, which tends to increase the cost. A modulator using the widely used LN crystals as the base has a large size and thus inhibits miniaturization of optical transmitters. In addition, the LN modulator requires high modulation voltage, but a dedicated IC and an electronic circuit are required to obtain such high modulation voltage, and thus increase in cost by such circuits is also a concern.

Review is being made on narrowing the modulation spectrum by special coding as a measure for performing long distance transmissions. However, such measure requires dedicated IC and high-frequency filter, and thus is not suited for miniaturization and lowering the cost.

Japanese Laid-Open Patent Publication No. 2005-327881 (Patent document 1) discloses a technique of using a ring resonator for wavelength lock in the wavelength variable laser. The ring resonator is used for wavelength lock, but application of such technique to modulation using the external modulator is not suggested in patent document 1.

Japanese Laid-Open Patent Publication No. 08-139401 (Patent document 2) discloses a configuration of converting frequency modulation to amplitude modulation by etalon wavelength characteristic. However, division of the gain region is not intended in patent document 2. Japanese Laid-Open Patent Publication No. 07-082131 (Patent document 3) discloses configuring a ring resonator with a waveguide. However, application of the ring resonator to the wavelength variable laser is not intended in patent document 3. Japanese Laid-Open Patent Publication No. 08-013017 (Patent document 4) discloses a method of applying frequency modulation to multivaluing. However, application to converting frequency modulation to amplitude modulation is not intended in patent document 4.

It is an exemplary object of the present invention to solve the problems in the related art and to provide a directly modulatable wavelength variable laser enabling long distance and large volume communication with a simple and compact configuration.

In order to achieve the above object, the wavelength variable laser according to the present invention includes a semiconductor optical amplifier, an optical filter, and a frequency-amplitude converter; wherein the semiconductor optical amplifier produces optical gain of a light signal; the optical filter configured by a multi-stage connected waveguide ring resonators performs frequency modulation on the light signal; and the frequency-amplitude converter performs amplitude modulation on the light signal frequency modulated in the optical filter.

According to an exemplary aspect of the present invention, the optical filter is configured using waveguide ring resonators, and conversion process of frequency modulation to amplitude modulation is performed on the light signal to generate light signal of low wavelength charping suited for long distance and large volume.

In the exemplary aspect of the invention, the frequency-amplitude converter is desirably configured by a waveguide ring resonator. The bias current carried to a modulating region of the semiconductor optical amplifier is desirably set lower than a bias current carried to a gain region of the semiconductor optical amplifier.

In the exemplary aspect of the invention, the optical filter changes oscillation wavelength according to a bias current carried to a modulating region of the semiconductor optical amplifier and performs frequency modulation on the light signal.

In the exemplary aspect of the invention, the frequency-amplitude converter desirably has a configuration of introducing light signal frequency modulated in the optical filter and light signal not passed through the optical filter, and performing amplitude modulation on the light signal. The semiconductor optical amplifier, the optical filter, and the frequency-amplitude converter are desirably integrated and formed on a same substrate.

As an exemplary advantage according to the present invention, the optical filter is configured using waveguide ring resonators, and conversion processing of frequency modulation to amplitude modulation is performed on the light signal to generate light signal of low wavelength charping suited for long distance and large volume.

As a further exemplary advantage according to the present invention, in addition to the function of wavelength variable, the optical transmitter enabling long distance and large volume transmission is realized with a simple configuration without using an expensive and large optical device such as LN modulator.

BRIEF DESCRIPTION OF THE DRAWINGS

The invention, together with objects and advantages thereof, may best be understood by reference to the following description of the presently preferred exemplary embodiment together with the accompanying drawings in which.

DETAILED DESCRIPTION OF THE EXEMPLARY EMBODIMENTS

The exemplary embodiment of the present invention will now be described in detail based on the drawings.

Figure 1:
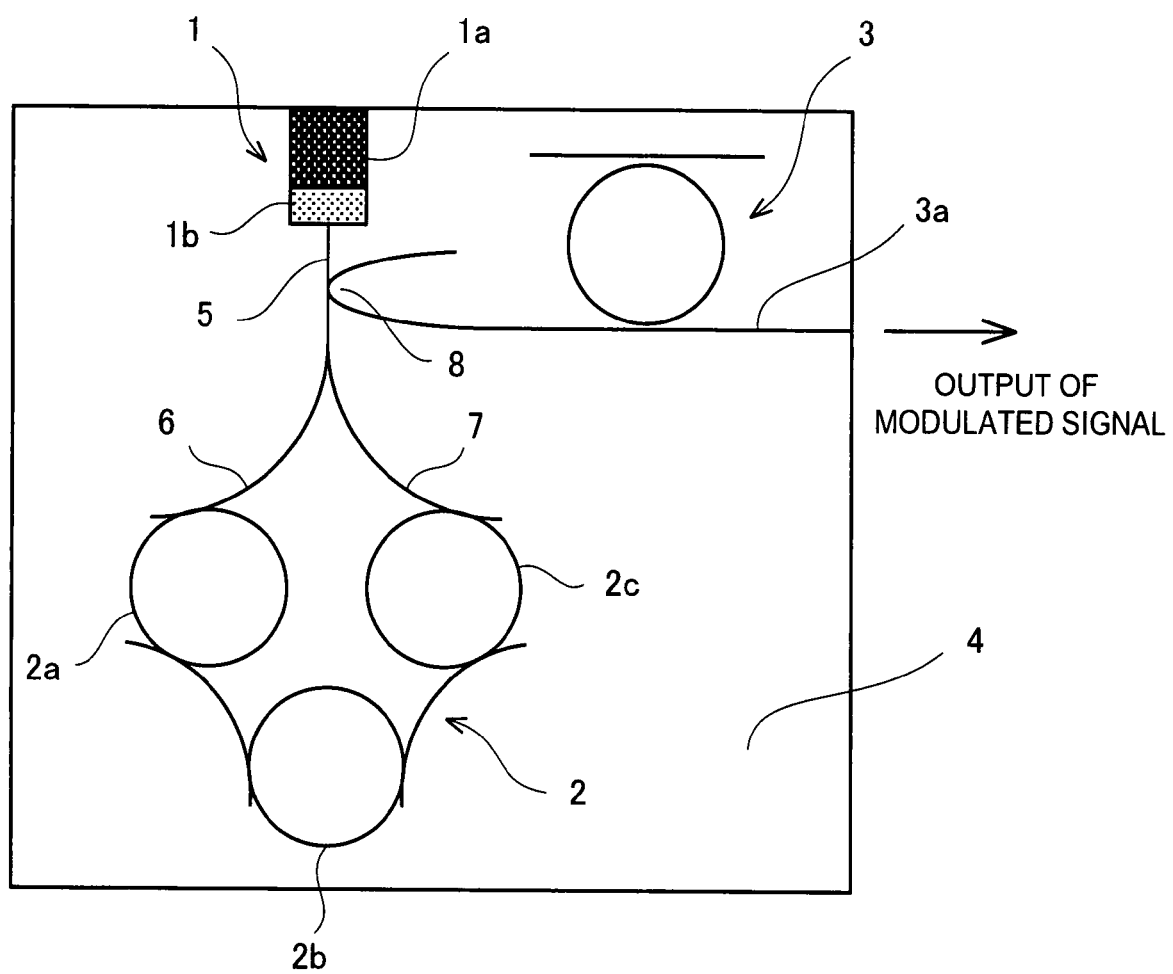
FIG. 1 is a configuration view showing a wavelength variable laser according to an exemplary embodiment of the present invention.

As shown in FIG. 1, a wavelength variable laser according to the exemplary embodiment of the present invention includes a semiconductor optical amplifier (SOA) 1, an optical filter 2, and a frequency-amplitude modulator 3, which are integrated and formed on the same substrate 4.

The semiconductor optical amplifier 1 produces optical gain, and includes a gain region 1a and a modulating region 1b. The gain region 1a and the modulating region 1b are formed by the same composition, where constant current is carried to the gain region 1a, and the constant current is biased so that modulated current is carried to the modulating region 1b.

A waveguide 5 is connected to the output side of the modulating region 1b of the semiconductor optical amplifier 1, where the distal end side of the waveguide 5 is Y-branched to form two branched waveguides 6, 7.

The optical filter 2 performs wavelength selection of the wavelength variable laser. The optical filter 2 has a configuration of multi-stage connected waveguide ring resonators 2a, 2b, 2c. In FIG. 1, the waveguide ring resonators 2a, 2b, 2c are three-stage connected, but are not limited thereto. The waveguide ring resonator configuring the optical filter 2 merely needs to be two or more stages, and the number of stages to be connected is not limited.

The waveguide ring resonator 2a, which is the first stage of the multi-stage connection, is connected to one branched waveguide 6 of the Y-branch, and the waveguide ring resonator 2c, which is the last stage of the multi-stage connection, is connected to the other branched waveguide 7 of the Y-branch.

Figure 2:
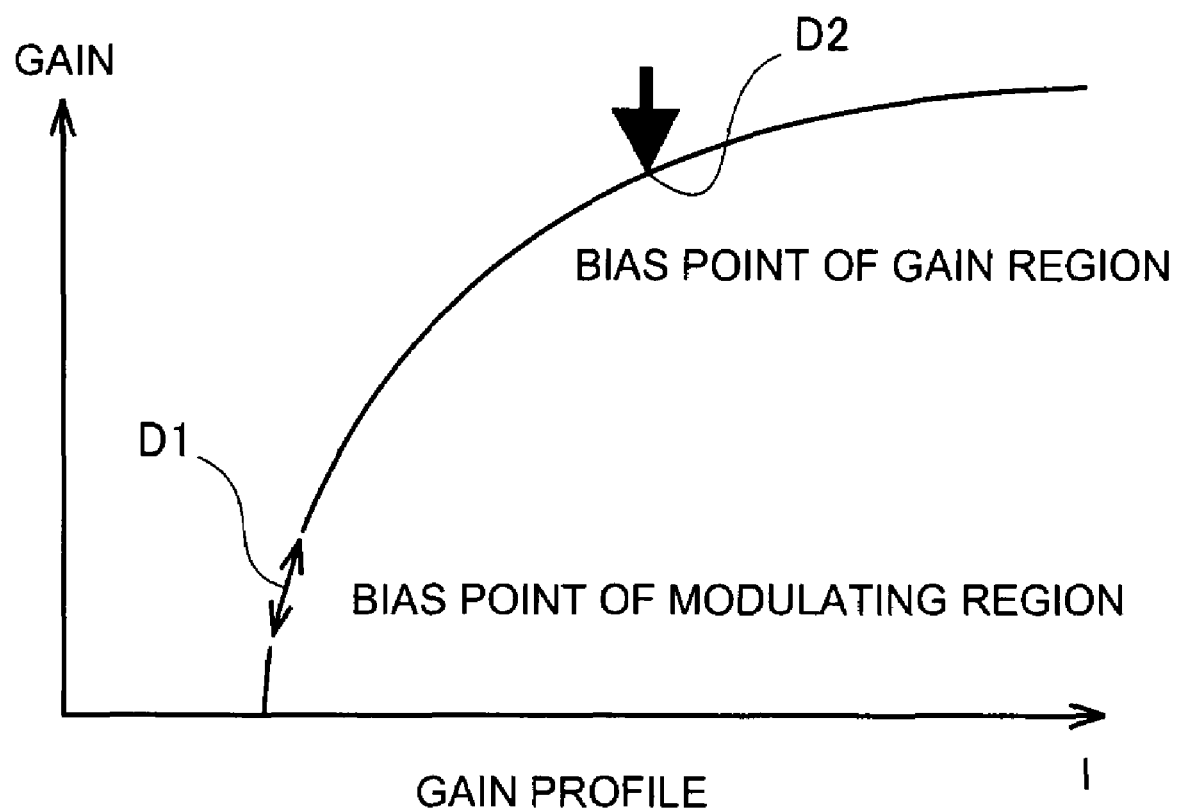
FIG. 2 is a characteristic view showing the gain profile of the semiconductor laser.

As shown in FIG. 2, when the optical filter 2 has a configuration in which the waveguide ring resonators 2a, 2b, 2c are multi-stage connected, the oscillation wavelength of the optical filter 2 changes according to the modulated current to be applied to the modulating region 1b of the semiconductor optical amplifier 1, whereby frequency modulation can be performed in the optical filter 2.

The frequency-amplitude converter 3 configured by a waveguide ring resonator converts the light signal frequency modulated in the optical filter 2 to an amplitude modulated light signal. That is, the frequency-amplitude converter 3 performs FM-AM (Frequency Modulation-Amplitude Modulation) conversion.

The frequency-amplitude converter 3 has an optical tap 8 on the input side. The optical tap 8 is configured by an optical coupler and is optically coupled to the waveguide 5. The optical tap 8 introduces the light signal frequency modulated in the optical filter 2 to the frequency-amplitude converter 3, and also introduces the light signal that has not passed the optical filter 2, that is, light signal output from the semiconductor optical amplifier 1 directly to the frequency-amplitude converter 3.

The operation of the wavelength variable laser according to the exemplary embodiment of the present invention will now be described.

The light signal output from the semiconductor laser such as DFB laser (not shown) is input to the gain region 1a of the semiconductor optical amplifier 1. Constant current is carried to the gain region 1a of the semiconductor optical amplifier 1, and constant current is biased so that modulated current is carried to the modulating region 1b of the semiconductor optical amplifier 1, whereby gain of the light signal input to the semiconductor optical amplifier 1 is ensured, that is, optical gain of the light signal is produced.

The semiconductor optical amplifier 1 outputs the gain adjusted light signal to the waveguide 5 that is not Y-branched. The light signal input to the waveguide 5 is then input to the optical filter 2 through one waveguide 6 of the Y-branch.

The optical filter 2 passes the introduced light signal from the waveguide ring resonator 2a of the first stage towards the waveguide ring resonator 2c of the last stage, and performs frequency modulation on the light signal. That is, in the process of passing the introduced light signal from the waveguide ring resonator 2a of the first stage towards the waveguide ring resonator 2c of the last stage, the optical filter 2 changes the oscillation wavelength by the waveguide ring resonator 2a, 2b, 2c according to the modulated current carried to the modulating region 1b of the semiconductor optical amplifier 1 and performs frequency modulation on the light signal.

The optical filter 2 outputs the frequency modulated light signal to the frequency-amplitude converter 3 via the other waveguide 7 of the Y-branch.

When the frequency modulated light signal is introduced from the optical tap 8, the frequency-amplitude converter 3 performs the process of converting frequency modulation to amplitude modulation on the relevant light signal to convert the frequency modulated component of the light signal to the amplitude modulated component.

The frequency-amplitude converter 3 introduces the light signal that has not passed the optical filter 2 out of the light signal output from the semiconductor optical amplifier 1 from the optical tap 8, and performs the process of converting frequency modulation to amplitude modulation on the introduced light signal. The frequency-amplitude converter 3 prevents band narrowing by the optical filter 2 and suppresses degradation of high speed response characteristics to a minimum by performing the process of converting frequency modulation to amplitude modulation on the light signal that has not passed the optical filter 2.

The frequency-amplitude converter 3 outputs the light signal subjected to conversion process of frequency modulation to amplitude modulation to the output terminal 3a.

The bias current D1 carried to the modulating region 1b of the semiconductor optical amplifier 1 is set to a point lower than the bias current D2 of the gain region 1a in the present exemplary embodiment. FIG. 2 shows the gain profile of the semiconductor laser. As apparent from FIG. 2, the amount of gain increase with respect to the increase in current increases by setting the bias current D1 carried to the modulating region 1b of the semiconductor optical amplifier 1 to lower than the bias current D2 of the gain region 1a. This corresponds to increase in differentiated gain, which is essential in improving high speed response characteristic.

Moreover, all red shift, which is essential in obtaining a satisfactory FM modulation characteristic in the frequency-amplitude converter 3, can be realized by suppressing the bias current D1 carried to the modulating region 1b of the semiconductor optical amplifier 1 to lower than the bias current D2 of the gain region 1a. The reason therefor will be described below.

When modulation is performed on the normal semiconductor laser, red shift due to heat generation by current injection occurs in the low speed region. However, since this does not have a response speed of up to MHz order, the blue shift due to carrier effect becomes dominant in the high speed region of higher than or equal to MHz. Dip, which is caused by reversal in the modulating direction, thus occurs in the frequency of KHz order. The modulating operation cannot be performed at lower than or equal to the dip frequency since the phase is inverted. In the semiconductor laser that all red shift operates, however, the dip does not occur and the modulating operation over a wide frequency of the GHz order from the DC becomes possible.

In the exemplary embodiment, the bias current of the modulating region 1b of the semiconductor optical amplifier 1 is set to lower than the gain region 1a. Thus, when the modulating region current is increased, the loss in the waveguide ring resonator configuring the frequency-amplitude converter 3 reduces, and the threshold carrier density decreases. The red shift is thereby achieved. As this matches the direction of heat generation by current injection, dip that is seen in the frequency modulation characteristic of the normal semiconductor laser does not occur and satisfactory modulation characteristic without phase inversion is achieved in a wide range of GHz band from the DC. That is, the modulation characteristic (all red shift) without dip in the low region at high speed modulation is obtained by utilizing the gain levering effect.

According to the invention described above, in addition to the function of wavelength variable, the optical transmitter enabling long distance and large volume transmission is realized with a simple configuration without using an expensive and large optical device such as LN modulator.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. A wavelength variable laser comprising:
   a semiconductor optical amplifier for producing optical gain of a light signal;
   a modulating region including a modulation region of the semiconductor optical amplifier, and an optical filter configured by a plurality of multi-stage connected waveguide ring resonators, for performing frequency modulation on the light signal; and
   a frequency-amplitude converter for performing amplitude modulation on the light signal frequency modulated in the modulating region,
   wherein a bias current carried to the modulating region of the semiconductor optical amplifier is set lower than a bias current carried to a gain region of the semiconductor optical amplifier.

2. The wavelength variable laser according to claim 1, wherein the frequency-amplitude converter is configured by a waveguide ring resonator.

3. The wavelength variable laser according to claim 1, wherein the modulating region changes oscillation wavelength according to the bias current carried to a the modulating region of the semiconductor optical amplifier and performs frequency modulation on the light signal.

4. The wavelength variable laser according to claim 1, wherein the frequency-amplitude converter introduces the light signal frequency modulated in the modulating region and a tight signal not passed through the modulating region, and performs amplitude modulation on the light signals.

5. The wavelength variable laser according to claim 1, wherein the semiconductor optical amplifier, the modulating region, and the frequency-amplitude convener are integrated and formed on a same substrate.

6. The wavelength variable laser according to claim 1, wherein at least two of the plurality of waveguide ring resonators are connected in series.

7. The wavelength variable laser according to claim 1, wherein the light signal not passed through the modulating region is diverted after passing through the semiconductor optical amplifier.

8. The wavelength variable laser according to claim 1, wherein the light signal output from the modulating region is input to a waveguide and output from the waveguide, by an optical tap, to the frequency-amplitude converter.

9. The wavelength variable laser according to claim 1, wherein the light signal input into the semiconductor optical amplifier is from a Distributed Feed Back laser.

10. The wavelength variable laser according to claim 1, wherein the light signal from the semiconductor optical amplifier is output into a waveguide.

11. The wavelength variable laser according to claim 10, wherein the light signal input into the waveguide is input into the modulating region by a waveguide of a Y-branch.

12. The wavelength variable laser according to claim 11, wherein the light signal output from the modulating region is input into another waveguide of the Y-branch.

13. A method for modulating a signal, comprising:
   producing optical gain of a light signal;
   performing frequency modulation on the light signal using a modulating region including a modulating region of a semiconductor optical amplifier, and an optical filter configured by a plurality of multi-stage connected waveguide ring resonators; and
   performing amplitude modulation on the light signal,
   wherein a bias current carried to the modulating region of the semiconductor optical amplifier is set lower than a bias current carried to a gain region or the semiconductor optical amplifier.

* * * * *